United States Patent
Iwamoto et al.

(10) Patent No.: US 11,276,599 B2
(45) Date of Patent: Mar. 15, 2022

(54) LOAD PORT APPARATUS, EFEM, AND METHOD OF INSTALLING LOAD PORT APPARATUS

(71) Applicant: TDK CORPORATION, Tokyo (JP)

(72) Inventors: Tadamasa Iwamoto, Tokyo (JP); Takuya Kudo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/896,319

(22) Filed: Jun. 9, 2020

(65) Prior Publication Data
US 2021/0384056 A1 Dec. 9, 2021

(51) Int. Cl.
*H01L 21/677* (2006.01)

(52) U.S. Cl.
CPC .. *H01L 21/67775* (2013.01); *H01L 21/67766* (2013.01); *H01L 21/67769* (2013.01)

(58) Field of Classification Search
CPC ......... H01L 21/67775; H01L 21/67766; H01L 21/67769
See application file for complete search history.

(56) References Cited

U.S. PATENT DOCUMENTS

| | | | | |
|---|---|---|---|---|
| 6,138,721 A * | 10/2000 | Bonora | ............. | H01L 21/67775 141/98 |
| 2003/0012626 A1* | 1/2003 | Aggarwal | ......... | H01L 21/67775 414/217.1 |
| 2010/0204826 A1* | 8/2010 | Sawado | ............ | H01L 21/67766 700/228 |
| 2014/0363258 A1* | 12/2014 | Iwamoto | ........... | H01L 21/67772 414/217 |
| 2016/0260628 A1* | 9/2016 | Ochiai | ............. | H01L 21/67369 |
| 2019/0148200 A1* | 5/2019 | Kuo | .................. | H01L 21/67265 414/217.1 |
| 2019/0326134 A1* | 10/2019 | Suzuki | ............. | H01L 21/67766 |

FOREIGN PATENT DOCUMENTS

| JP | H11-246036 A | 9/1999 |
|---|---|---|
| JP | 2013-110192 A | 6/2013 |

* cited by examiner

*Primary Examiner* — Glenn F Myers
(74) *Attorney, Agent, or Firm* — Oliff PLC

(57) ABSTRACT

A load port apparatus includes an installation section, a frame section, a first wheel, a second wheel, and a supporter. The installation section includes an installation surface for installing a container for containing a substrate. The frame section is disposed on one side of the installation section, extends upward from this one side, and includes a lower fixation unit located below the installation surface. The first wheel is attached below the installation section and has a first diameter. The second wheel is attached below the installation section and further away from the frame section than the first wheel and has a second diameter smaller than the first diameter. The supporter is attached below the installation section and further away from the frame section than the first wheel and has a vertically adjustable distance from the installation surface to a lower end of the supporter.

8 Claims, 7 Drawing Sheets

LOAD PORT APPARATUS, EFEM, AND METHOD OF INSTALLING LOAD PORT APPARATUS

BACKGROUND OF THE INVENTION

The present invention relates to, for example, a load port apparatus including an installation section for installing a container for containing a substrate.

In plants for manufacturing semiconductor, substrates (e.g., silicon wafers) are contained in a container referred to as a FOUP, and the substrates to be processed are transported among machines or stored. Each of the machines includes a load port apparatus for delivering the container to a transportation machine (e.g., OHT) for transporting the container. The load port apparatus includes an installation section for installing the substrates, a door for opening or closing a lid of the container, and the like.

Many of the machines constituting the semiconductor plants are modularized. For example, when the load port apparatus is incorporated into an EFEM, it is normal that the load port apparatus assembled outside the semiconductor plants is brought into the plants and fixed to the wall of the substrate transportation chamber of the EFEM. To transport the load port apparatus in the plants, thereby proposed are a load port apparatus being mountable on a carriage, a load port apparatus with wheels (casters), and the like (Patent Document 1 and Patent Document 2).

In accordance with the increase in size of substrates to be processed in semiconductor plants, the size and weight of the load port apparatus are now increasing. Thus, demanded is a load port apparatus capable of further stably moving in the plants and of being easily attached to the wall of the substrate transportation chamber in assembling the EFEM or installing the load port apparatus.

Patent Document 1: JPH11246036 (A)
Patent Document 2: JP2013110192 (A)

BRIEF SUMMARY OF INVENTION

The present invention has been achieved under such circumstances. It is an object of the invention to provide a load port apparatus capable of further stably moving in a plant and of being easily attached to a wall of a substrate transportation chamber or so.

To achieve the above object, a load port apparatus according to the present invention includes:

an installation section including an installation surface for installing a container for containing a substrate;

a frame section disposed on one side of the installation section, extending upward from this one side, and including a lower fixation unit for wall fixation located below the installation surface;

a first wheel attached below the installation section and having a first diameter and a distance from the installation surface to a lower end of the first wheel being equal to a first length;

a second wheel attached below the installation section and further away from the frame section than the first wheel and having a second diameter smaller than the first diameter and a distance from the installation surface to a lower end of the second wheel being equal to a second length smaller than the first length, and a supporter attached below the installation section and further away from the frame section than the first wheel and having a second diameter smaller than the first diameter and having a distance from the installation surface to a lower end of the supporter being vertically adjustable in a range including the first length.

The load port apparatus according to the present invention includes the first wheel and the second wheel having different distances from the installation surface to their lower end and can thereby move while the installation surface is being inclined so that the upper part of the frame section is inclined to the installation section. Thus, the load port apparatus can stably move in a plant and can advantageously be prevented from falling down during movement in the plant. Since the diameter (outer diameter) of the first wheel is larger than that of the second wheel, the load port apparatus can be prevented from falling down even if it shakes more or less during movement, and the second wheel can easily float in attaching the load port apparatus. This makes it possible to easily and safely fix the fixation unit to the wall. After the load port apparatus is attached, the weight of the load port apparatus is supported by the supporter. This reduces a weight load to the fixation unit and the wall and achieves a stable fixation state.

For example, the supporter may be disposed separately from the second wheel and located closer to the second wheel than to the first wheel.

In this structure, the second wheel is disposed away from the first wheel and the fixation unit, and the load port apparatus can thereby achieve a further stable fixation state. In addition, the second wheel and the supporter are arranged separately from each other, and the structure of the second wheel can thereby be simplified.

For example, each of the first wheel and the second wheel may be attached so that the distance from the installation surface to the lower end of the first wheel or the second wheel is unchangeable.

In this load port apparatus, the structure of the first wheel and the second wheel can be simplified, and the strength is easily ensured.

For example, the distance from the installation surface to the lower end of the second wheel may be adjustable between the second length and the first length, and the second wheel may also function as the supporter.

When the second wheel also functions as the supporter, the load port apparatus can reduce the number of operations for attachment and detachment and also reduce the number of components.

For example, the load port apparatus according to the present invention may further include an adjustment plate disposed on a wall for fixing the frame section and to which the fixation unit is fixed so that a location of the fixation unit is adjustable.

The load port apparatus including the adjustment plate can be attached to the wall by being easily corrected to an appropriate posture.

An EFEM includes any of the above-mentioned load port apparatuses; and a substrate transportation chamber including an adjustment plate disposed on a wall for fixing the frame section and to which the fixation unit is fixed so that a location of the fixation unit is adjustable.

In the EFEM, the load port apparatus is easily attached, detached, and replaced.

A method of installing the load port apparatus according to the present invention including an installation section capable of installing a container for containing a substrate onto an installation surface, includes the steps of:

contacting a first wheel and a second wheel with a floor and moving them to a wall, wherein the first wheel is attached below the installation section and has a first diameter and a distance from the installation surface to a lower end of the first wheel being equal to a first length, and the second wheel is attached below the installation section and further away from the frame section than the first wheel and has a second diameter smaller than the first diameter and a distance from the installation surface to a lower end of the second wheel being equal to a second length smaller than the first length;

fixing a fixation unit for wall fixation to the wall by floating the second wheel, wherein the fixation unit is disposed below the installation surface in a frame section disposed one lateral surface of the installation section and extending upward from this lateral surface; and contacting a supporter with the floor so that a distance from the installation surface to a lower end of the supporter is adjusted to the first length, wherein the supporter is attached below the installation section and further away from the frame section than the first wheel and is adjustable vertically.

In the method of installing the load port apparatus, the load port apparatus can advantageously be prevented from falling down while stably moving in the plant and can be installed easily and safely. The method achieves a stable fixation state of the load port apparatus.

DETAILED DESCRIPTION OF INVENTION

Figure 1:
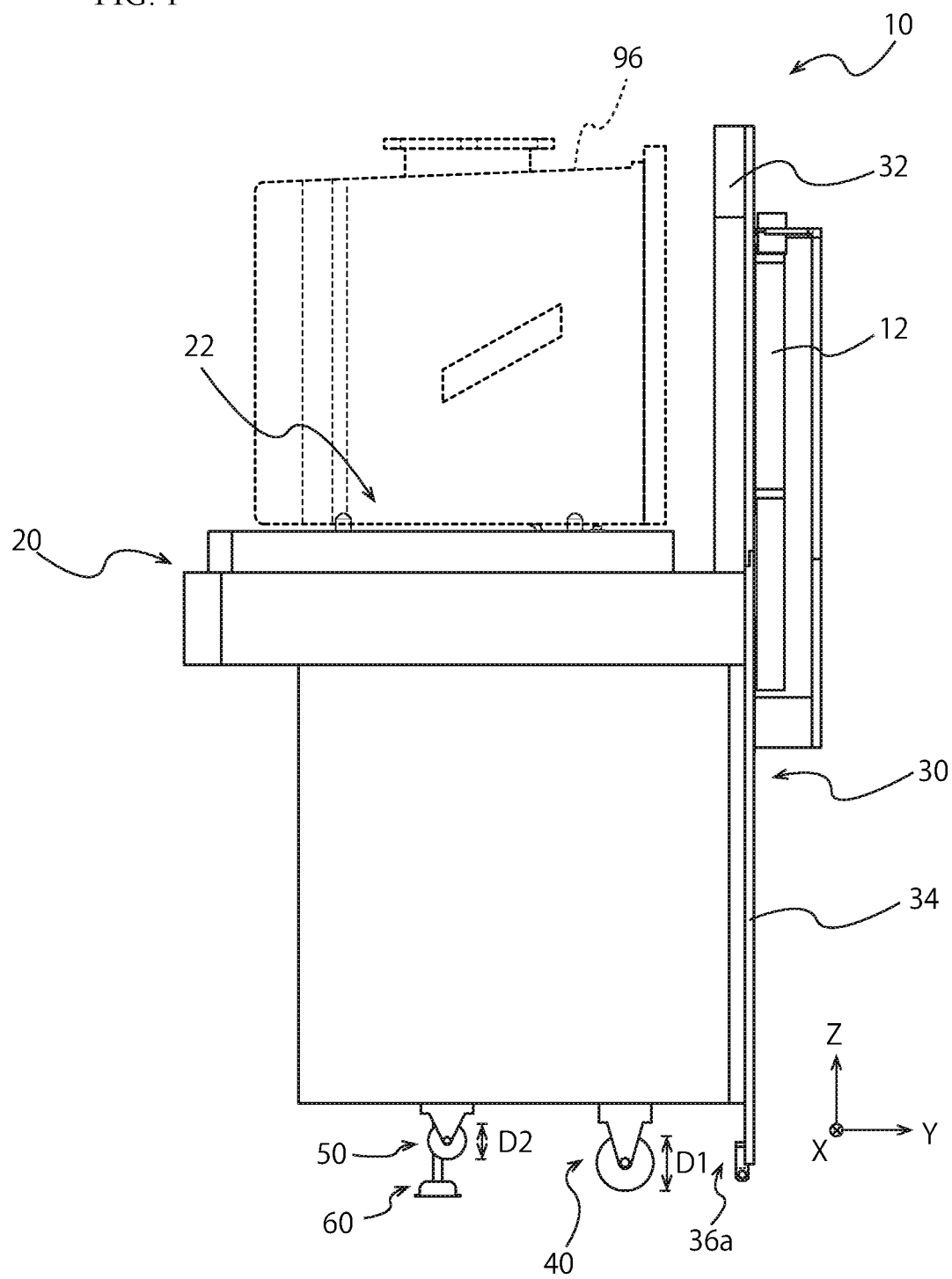
FIG. 1 is a lateral view of a load port apparatus according to an embodiment of the present invention.

Hereinafter, an embodiment of the present invention is explained with reference to the figures. FIG. 1 is a lateral view of a load port apparatus 10 according to an embodiment of the present invention. As shown in FIG. 1, the load port apparatus 10 includes an installation section 20 having an installation surface 22 for installing a FOUP 96 as a container for containing substrates. As mentioned below, the load port apparatus 10 is installed in a wall 82 of a substrate transportation chamber 80 where a mini environment is formed inside an EFEM 90 and constitutes a part of the EFEM 90 (see FIG. 4).

Figure 4:
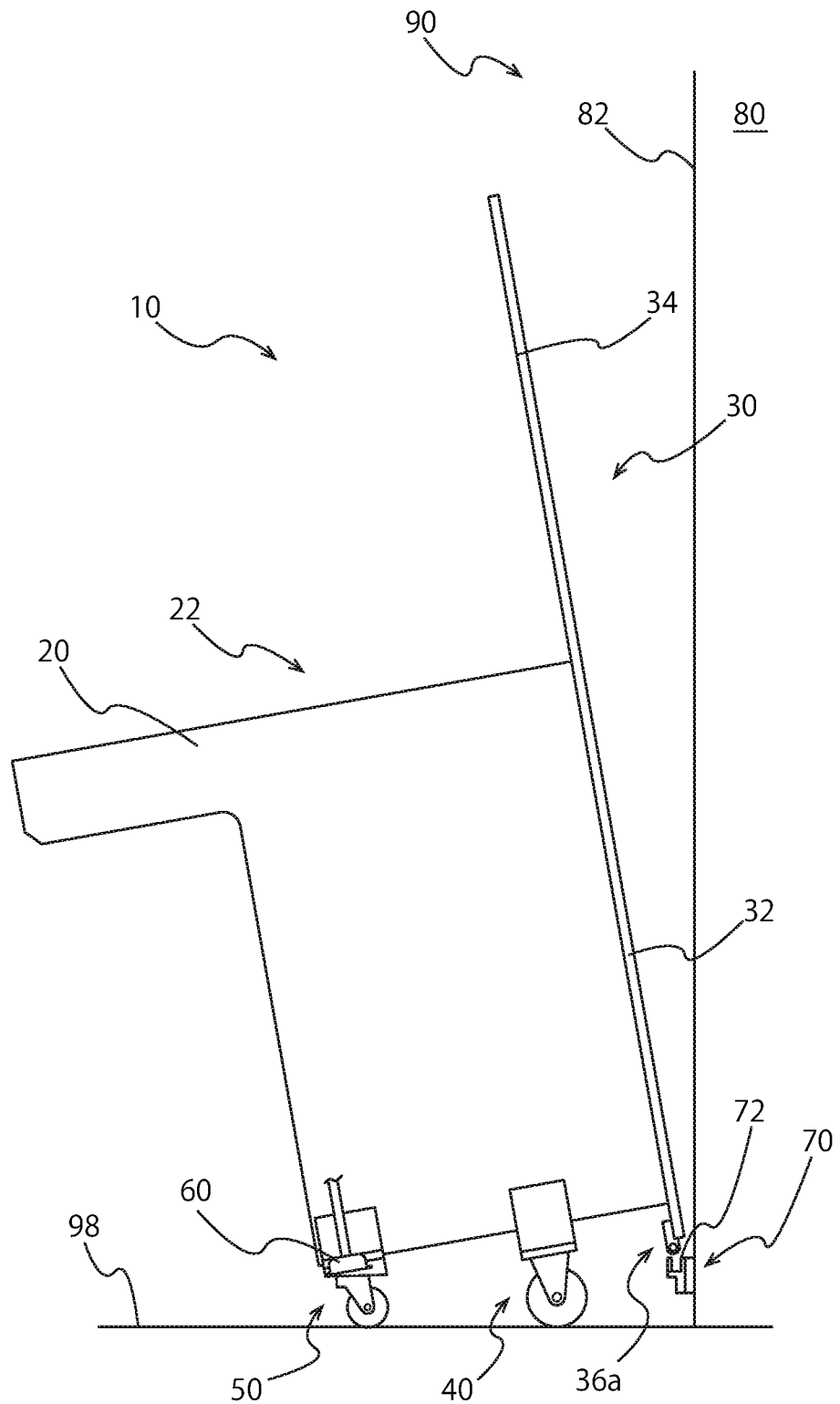
FIG. 4 is a conceptual view of a first step of a method of installing the load port apparatus shown in FIG. 1.

Although not illustrated in FIG. 4, a robot arm for wafer transportation is disposed in the substrate transportation chamber 80. The robot arm takes substrates (e.g., silicon wafers) contained in the FOUP 96 installed in the load port apparatus 10 and transports the substrates to the semiconductor processing equipment via the mini environment.

As shown in FIG. 1, the load port apparatus 10 includes: the installation section 20; a frame section 30 disposed on one side of the installation section 20 (positive side in the Y-axis direction) and extending upward from this one side; first wheels 40, second wheels 50, and supporters 60 attached below the installation section 20; a door 12; and the like.

In the explanation of the load port apparatus 10, as shown in FIG. 1, the Z-axis direction is a normal direction of the installation surface 22 of the load port apparatus 10, the Y-axis direction is a direction where a movable table mounting the FOUP 96 moves to or from the frame section 30, and the X-axis direction is a direction perpendicular to the Z-axis direction and the Y-axis direction. The load port apparatus 10 is fixed to a wall 82 so that the installation surface 22 and the Z-axis direction correspond to the horizontal direction and the vertical direction, respectively. The installation surface 22 of the installation section 20 is defined by a positioning pin disposed in the installation section 20 and configured to contact with the FOUP 96.

Figure 2:
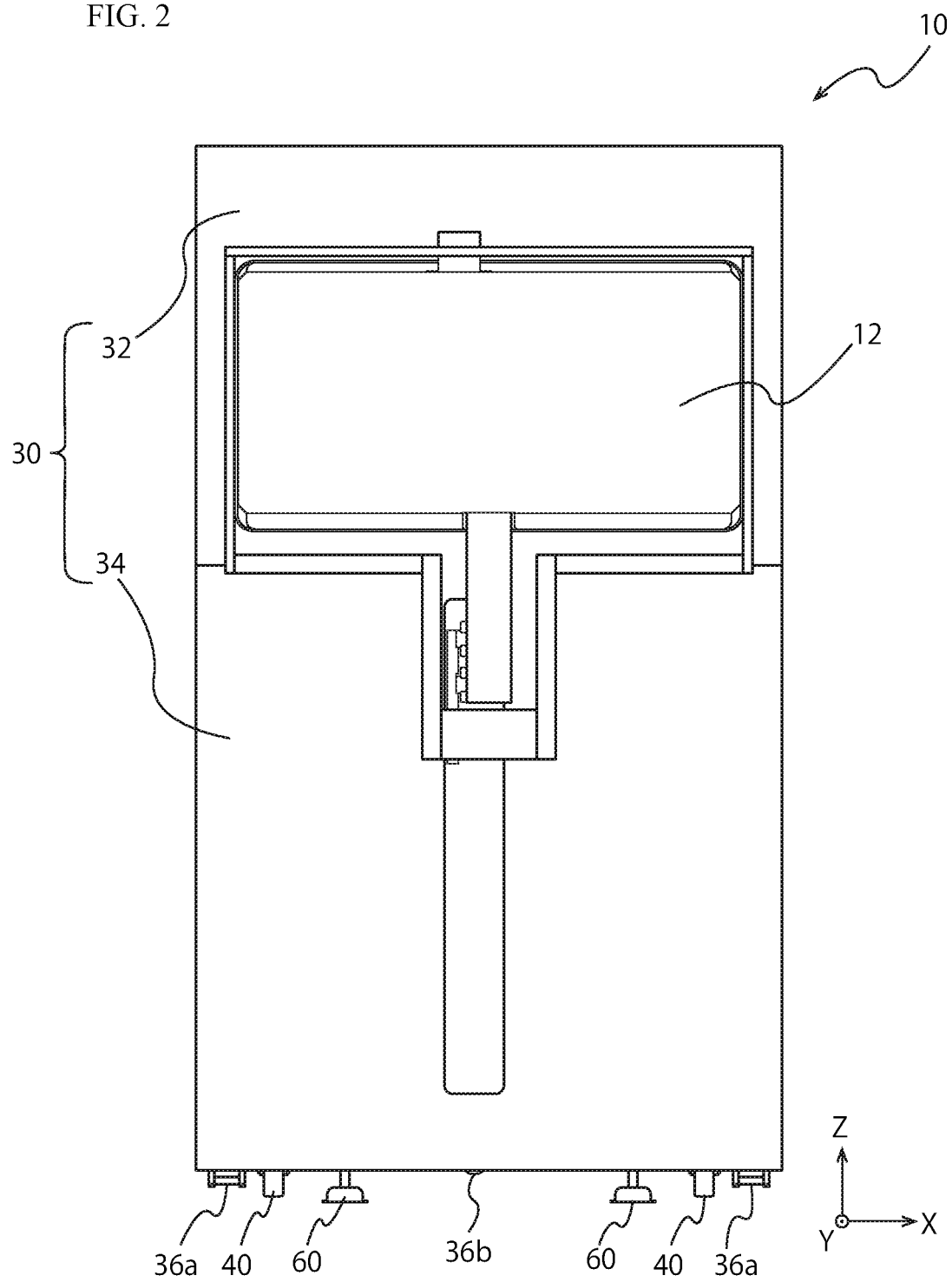
FIG. 2 is a back view of the load port apparatus shown in FIG. 1 viewed from a back of a frame section.

As shown in FIG. 1, the frame section 30 is disposed on the positive side of the Y-axis direction (one side along the installation surface 22 of the installation section 20). FIG. 2 is a back view of the load port apparatus 10 shown in FIG. 1 viewed from the positive side of the Y-axis direction. The frame section 30 includes a lower frame 34 disposed on one side of the installation section 20 and located below the installation surface 22 and an upper frame 32 extending upward from the installation section 20.

The upper frame 32 includes an opening opened or closed by the door 12. The door 12 is driven by a drive unit not illustrated and opens or closes a lid of the upper frame 32 and the FOUP 96.

Figure 3:
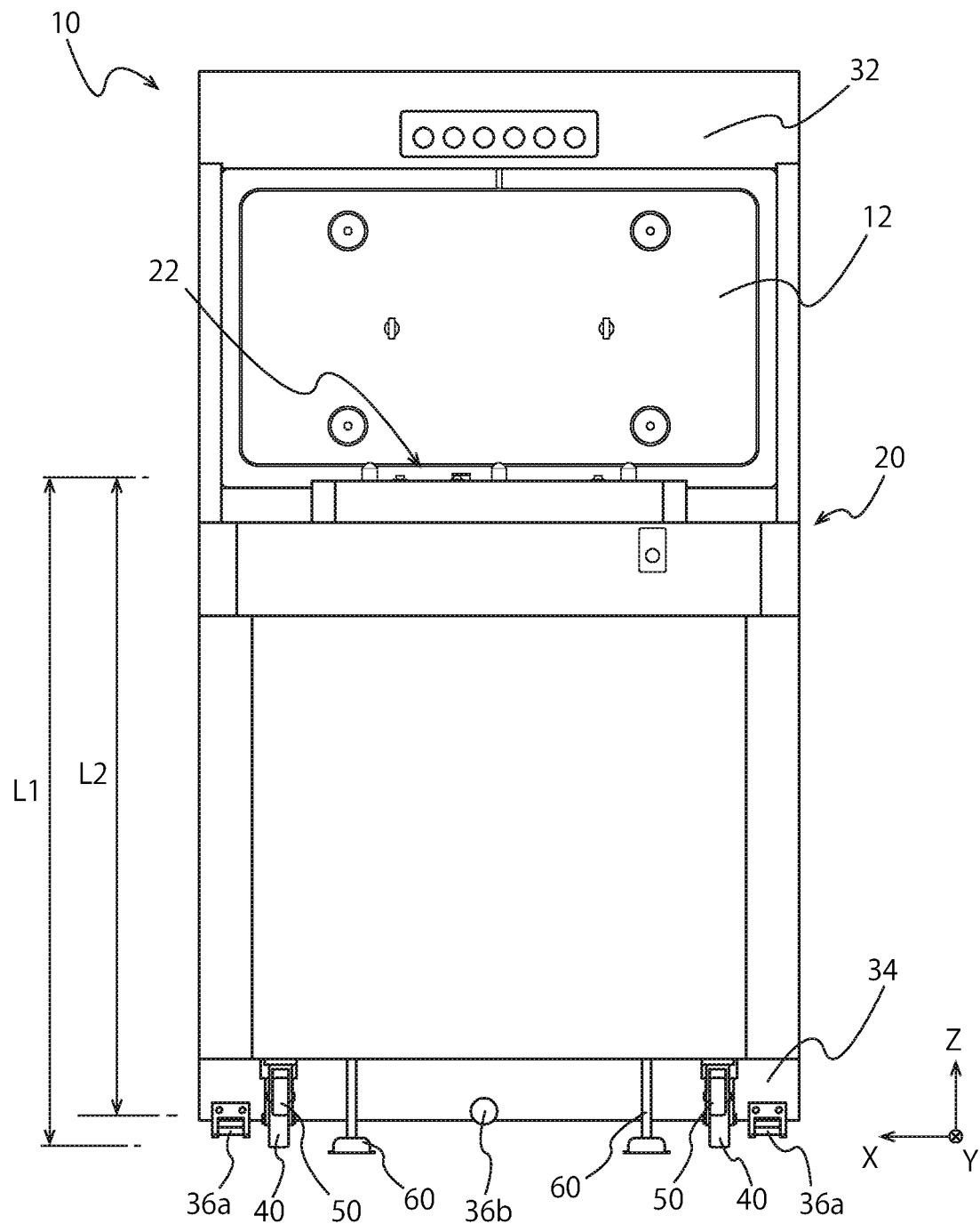
FIG. 3 is a front view of the load port apparatus shown in FIG. 1 viewed from an installation section.

FIG. 3 is a front view of the load port apparatus 10 viewed from the negative side in the Y-axis direction. The lower end of the lower frame 34 located below the installation surface 22 is provided with first lower fixation members 36a and a second lower fixation member 36b (a lower fixation unit 36 for wall fixation).

The first lower fixation members 36a are arranged on both sides (two points) of the lower frame 34 in the X-axis direction. Each of the first lower fixation members 36a has a cylindrical bar part extending in the horizontal direction (X-axis direction). When the load port apparatus 10 is attached to the wall 82, the cylindrical bar parts of the first lower fixation members 36a are engaged with engagement members 72 included in an adjustment plate 70 disposed on the wall 82 of the substrate transportation chamber 80.

As shown in FIG. 3, the second lower fixation member 36b is disposed in a central part of the lower frame 34 in the X-axis direction. As with the first lower fixation members 36a, the second lower fixation member 36b is engaged with an engagement member disposed in a central part of the adjustment plate 70.

As shown in FIG. 3, the first wheels 40 are located below the installation section 20 and at the lower end of the load port apparatus 10 (the end on the negative side of the Z-axis direction). The first wheels 40 are arranged on both sides (two points) in the X-axis direction. Except for the location in the X-axis direction, the configurations of the two first wheels 40 are similar to each other.

As shown in FIG. 3, a first length L1 is a distance from the installation surface 22 to the lower ends of the first wheels 40. As shown in FIG. 1, a first diameter D1 is a diameter (outer diameter) of the first wheels 40. Compared to the second wheels 50, the first wheels 40 are arranged on the positive side of the Y-axis direction, in other words, closer to the frame section 30.

As shown in FIG. 2, the lower ends of the first wheels 40, the first lower fixation members 36a, and the second lower fixation member 36b are exposed downward (the negative side of the Z-axis direction) from the lower end of the frame section 30. On the other hand, the lower ends of the second wheels 50 are not exposed downward from the lower end of the frame section 30.

As shown in FIG. 3, as with the first wheels 40, the second wheels 50 are located below the installation section 20 and near the lower end of the load port apparatus 10. As with the first wheels 40, the second wheels 50 are arranged on both sides (two points) of the X-axis direction, and except for the location in the X-axis direction, the configurations of the two second wheels 50 are similar to each other. The locations of the second wheels 50 in the X-axis direction substantially correspond with those of the first wheels 40 in the X-axis direction.

As shown in FIG. 3, a second length L2 is a distance from the installation surface 22 to the lower ends of the second wheels 50 and is smaller than the first length L1. As shown in FIG. 1, a second diameter D2 is a diameter (outer diameter) of the second wheels 50 and is smaller than the first diameter D1. Compared to the first wheels 40, the second wheels 50 are attached on the negative side of the Y-axis direction, in other words, further away from the frame section 30.

As shown in FIG. 4, which explains a first step of a method of installing the load port apparatus 10, when both of the first wheels 40 and the second wheels 50 are contacted with a floor 98, the installation surface 22 of the load port apparatus 10 is not parallel to the floor 98 and inclined away from the frame section 30 to the floor 98. In addition, the frame section 30 is not perpendicular to the floor 98, and the upper frame 32 is inclined to the installation surface 22.

The axles of the first wheels 40 and the second wheels 50 shown in FIG. 3 may be fixed or turnable along a parallel surface to the installation surface 22, but the first wheels 40 and the second wheels 50 are attached so that the distance from the installation surface 22 to the lower ends of the first wheels 40 and the second wheels 50 is unchangeable. These first wheels 40 and the second wheels 50 are excellent in overload resistance compared to those whose height of the axle is variable.

Figure 6:
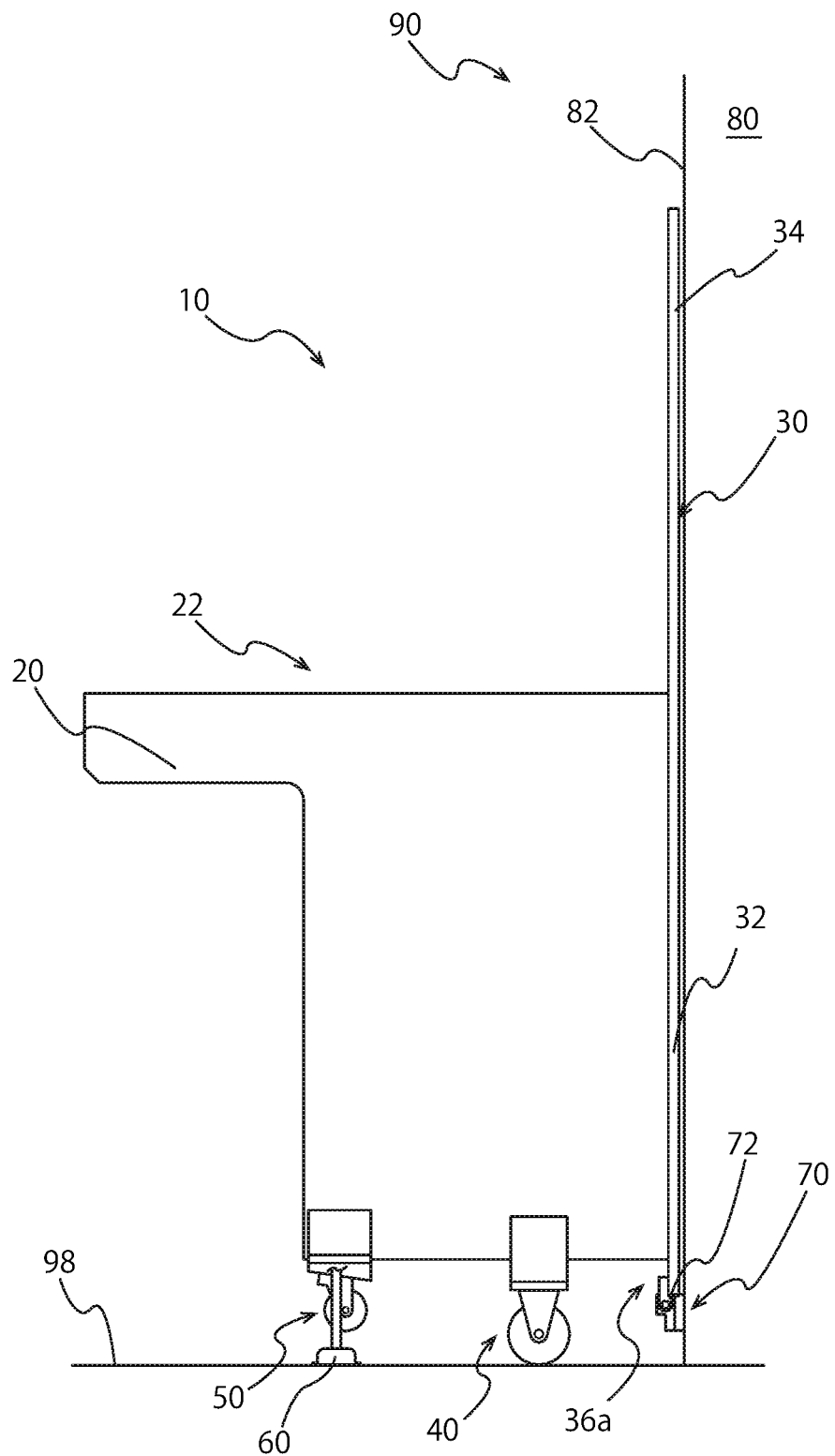
FIG. 6 is a conceptual view of a third step of a method of installing the load port apparatus shown in FIG. 1.

As shown in FIG. 3, the supporters 60 are arranged separately from the second wheels 50 and are located below the installation section 20 and near the lower end of the load port apparatus 10. As shown in FIG. 1, the supporters 60 are arranged closer to the second wheels 50 than to the first wheels 40 and are arranged at two locations sandwiched by the two second wheels 50. As shown in FIG. 6, the supporters 60 contact with the floor 98 and support the load port apparatus 10 while the load port apparatus 10 is being fixed to the wall 82.

As understood from the comparison between FIG. 4 and FIG. 6, the supporters 60 can vertically adjust a distance from the installation surface 22 to the lower ends of the supporters 60. The distance from the installation surface 22 to the supporters 60 is adjustable in a range including the second length L2 (see FIG. 3), which is a distance from the installation surface 22 to the lower ends of the second wheels 50. Preferably, the distance from the installation surface 22 to the supporters 60 is adjustable in a range including the first length L1, which is a distance from the installation surface 22 to the lower ends of the first wheels 40, and the second length L2 (see FIG. 3), which is a distance from the installation surface 22 to the lower ends of the second wheels 50.

The supporters 60 have any structure. For example, the supporters 60 have a structure in which the distance from the installation surface 22 is adjusted by screwing, sliding, or the like.

As shown in FIG. 1, compared to the first wheels 40, the supporters 60 are attached on the negative side of the Y-axis direction, in other words, further away from the frame section 30. The locations of the supporters 60 in the Y-axis direction are preferably closer to the second wheels 50 than to the first wheels 40 and more preferably overlap with the outer diameter of the second wheels 50 when viewed from the X-axis direction.

As shown in FIG. 4, the adjustment plate 70 is disposed on the wall 82 of the substrate transportation chamber 80 for fixing the frame section 30, and the lower fixation unit 36 disposed at the lower end of the frame section 30 is fixed so that the location of the lower fixation unit 36 is adjustable. The engagement members 72 included in the adjustment plate 70 include a groove opening upward. The groove has some leeway to the first lower fixation member 36a to be engaged with the groove. The adjustment plate 70 includes an adjustment mechanism (e.g., adjustment screw). The posture of the load port apparatus 10 is strictly adjusted after temporary fixation, and the frame section 30 is permanently fixed to the wall 82.

Figure 5:
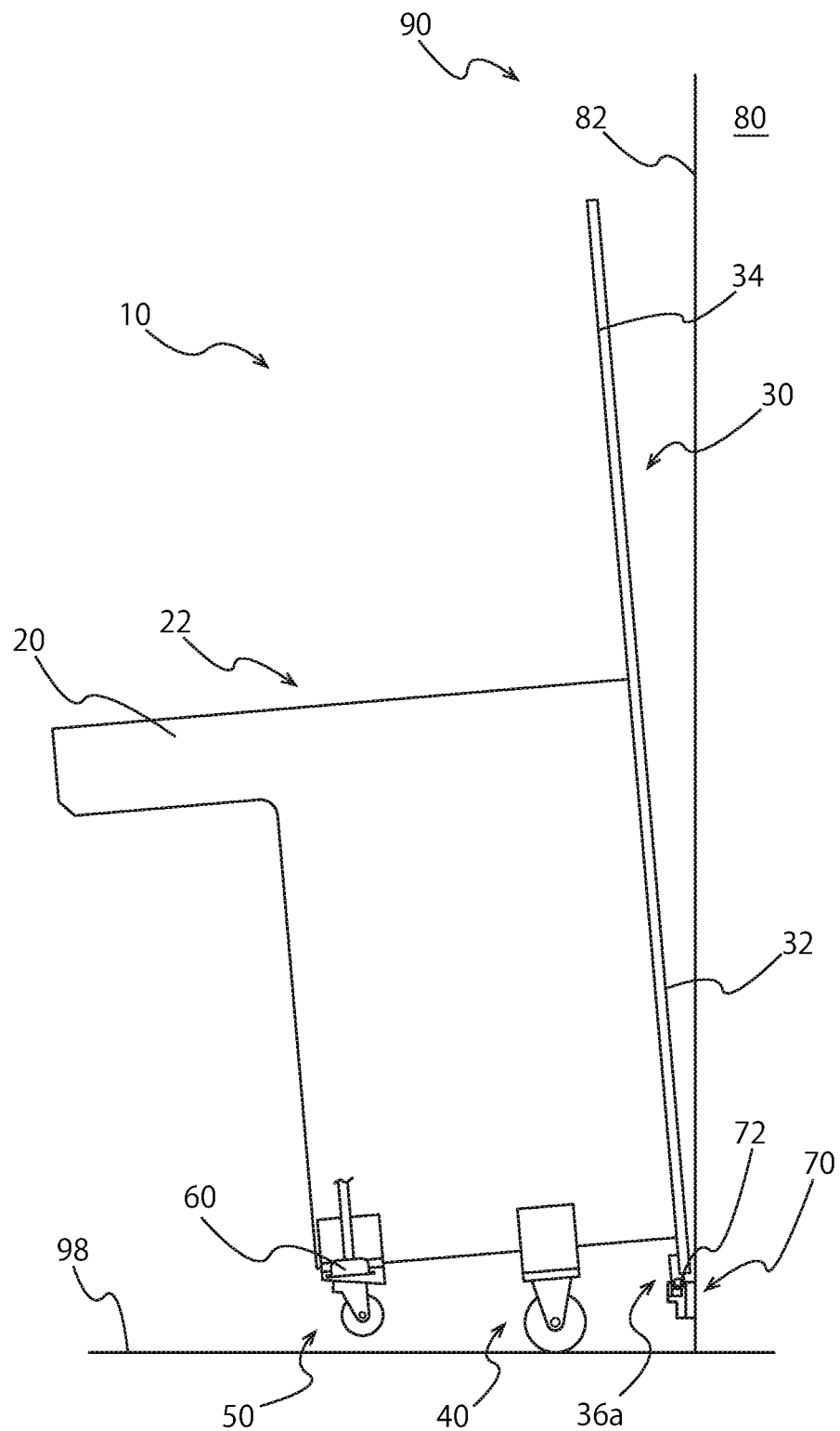
FIG. 5 is a conceptual view of a second step of a method of installing the load port apparatus shown in FIG. 1.

Hereinafter, a method of installing the load port apparatus 10 is explained with FIG. 4 to FIG. 6. FIG. 4 to FIG. 6 are conceptual views schematically illustrating a state of each step of the method of installing the load port apparatus 10. In FIG. 4 to FIG. 6, some structure of the load port apparatus 10 is simplified or not illustrated.

FIG. 4 is a conceptual view illustrating a first step of the method of installing the load port apparatus 10. In the first step, as shown in FIG. 4, the load port apparatus 10 is moved to the wall 82 (an installation target of the load port apparatus 10) by rotating the first and second wheels 40 and 50 while both of them are being contacted with the floor 98 of a semiconductor plant. In the first step, the lower ends of the supporters 60 are accommodated on the positive side of the Z-axis direction and are not contacted with the floor 98.

Since the distances from the installation surface 22 are different from each other between the first wheels 40 and the second wheels 50, the load port apparatus 10 is moved while being inclined as shown in FIG. 4. This favorably reduces a falling risk of the load port apparatus 10 during movement. This is because the load port apparatus 10 tends to fall on the back side (the positive side of the Y-axis direction in FIG. 1) in a vertical state of the frame section 30 due to a upward protrusion of the frame section 30 close to the first wheels 40 from the installation section 20 and an attachment of a weight (e.g., the door 12 shown in FIG. 1) to the upper frame 32, but the load port apparatus 10 with the inclined posture as shown in FIG. 4 can safely move in the semiconductor plant with a stable state without falling down.

Even if the second wheels 50 float unexpectedly during movement as the diameter of the first wheels 40 is larger than that of the second wheels 50, the load port apparatus 10 is hard to quickly change its posture and can move stably due to low curvature of the first wheels 40. When the load port apparatus 10 is moved by being pushed from the installation section 20, the load port apparatus 10 is easily moved as the diameter of the first wheels 40 located forward is larger.

In a second step of installing the load port apparatus 10, the second wheels 50 are floating from the floor 98 as shown in FIG. 5, and the first lower fixation members 36a of the lower fixation unit 36 arranged at the lower end of the frame section 30 are thereby engaged and fixed with the engagement members 72 of the adjustment plate 70 arranged on the wall 82 (see FIG. 6). Incidentally, the fixation at this stage is a temporary fixation for preventing the engagement between the load port apparatus 10 and the wall 82 from being released, and the posture adjustment (minor adjustment) of the load port apparatus 10 and the permanent fixation are carried out after a third step. Although not illustrated, the upper end of the frame section 30 is also preferably fixed to the wall 82, and an upper fixation unit fixed to the wall 82 is preferably disposed near the upper end of the frame section 30.

In the second step shown in FIG. 2, the load port apparatus 10 is moved to the wall 82 with inclined posture, and the first lower fixation members 36a located at the lower end of the frame section 30 can easily be engaged with the engagement members 72 of the adjustment plate 70. Since the diameter of the first wheels 40 is larger than that of the second wheels 50, the first lower fixation members 36a can be engaged with the adjustment plate 70 by posture change caused by rotation of the first wheels 40 around their axles. Since the diameter of the first wheels 40 is larger, the load port apparatus 10 is hard to quickly change its posture and can be installed safely.

In the third step of installing the load port apparatus 10, as shown in FIG. 6, the locations of the lower ends of the supporters 60 are adjusted so that the distance from the installation surface 22 to the lower ends of the supporters 60 is the first length L1 (i.e., the supporters 60 contacts with the floor 98) by extending the supporters 60 arranged next to the second wheels 50 to the downward direction.

Since the supporters 60 support the load port apparatus 10, the posture of the load port apparatus 10 is stable, and it is possible to reduce a load to the wall 82 in fixing the load port apparatus 10. Accordingly, the load port apparatus 10 is fixed to the wall 82 of the substrate transportation chamber 80 and constitutes a part of the EFEM 90.

Hereinbefore, the load port apparatus 10 and a method of installing it according to the present invention are explained with an embodiment, but the present invention is not limited to the embodiment. For example, the interval between the first wheels 40 and the second wheels 50 in the X-axis direction or the Y-axis direction and the number or arrangement of the first wheels 40 and the second wheels 50 are not limited to those shown in the embodiment.

Figure 7A:
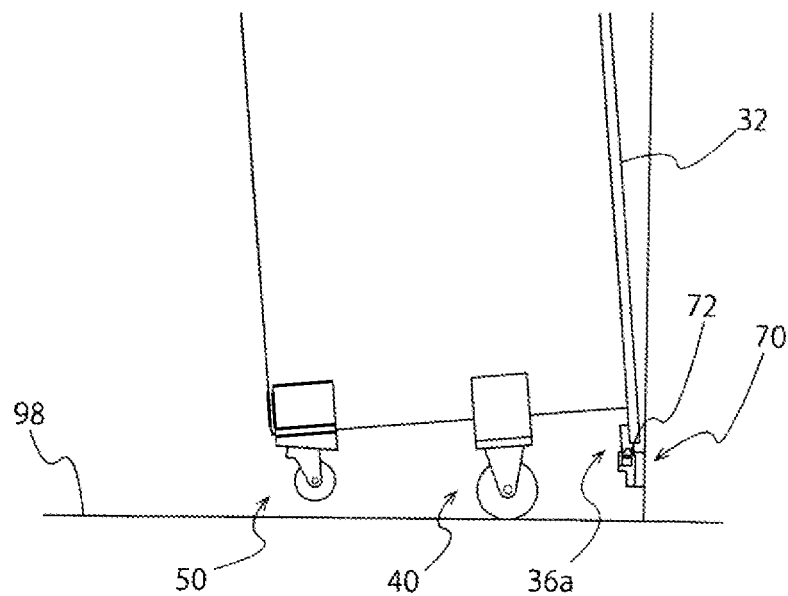
FIG. 7A is conceptual view of a second step of a method of installing a second embodiment of the present invention.
Figure 7B:
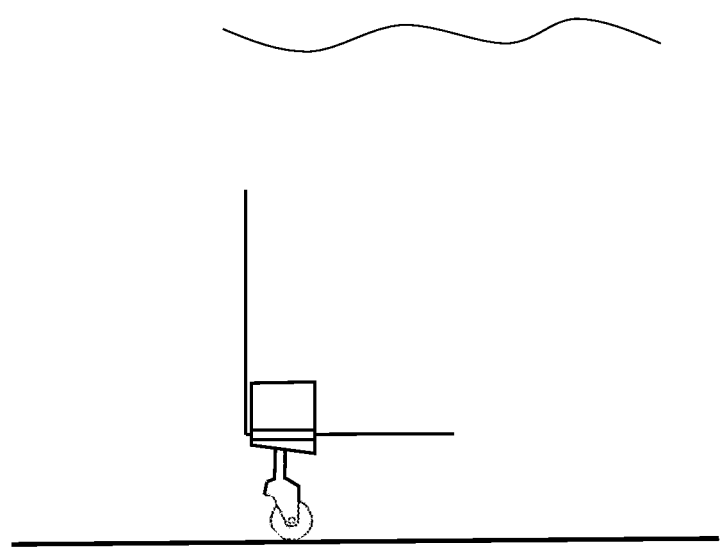
FIG. 7B is a conceptual view of a third step of a method of installing the second embodiment.

In the above-mentioned embodiment, the second wheels 50 have a structure in which the distance between the lower ends of the second wheels 50 and the installation surface 22 is fixed to the second length L2. However, in other embodiments, such as the embodiment illustrated in FIGS. 7A and 7B, the distance between the lower ends of the second wheels 50 and the installation surface 22 may be adjustable between the second length L2 and the first length L1. As with the supporters 60 shown in FIG. 6, these second wheels 50 can support the load port apparatus 10 and also function as the supporters after being fixed to the wall 82.

DESCRIPTION OF THE REFERENCE NUMERICAL

10 . . . load port apparatus
12 . . . door
20 . . . installation section
22 . . . installation surface
30 . . . frame section
32 . . . upper frame
34 . . . lower frame
36 . . . lower fixation unit
36a . . . first lower fixation member
36b . . . second lower fixation member
40 . . . first wheel
D1 . . . first diameter
L1 . . . first length
50 . . . second wheel
D2 . . . second diameter
L2 . . . second length
60 . . . supporter
70 . . . adjustment plate
72 . . . engagement member
80 . . . substrate transportation chamber
82 . . . wall
90 . . . EFEM
96 . . . FOUP
98 . . . floor

What is claimed is:

1. A load port apparatus comprising:
an installation section including an installation surface for installing a container containing a substrate;
a frame section (1) on one side of the installation section, (2) extending upward from the one side, and (3) including a lower wall fixation unit below the installation surface that is configured to be attached to and detachable from a wall of a substrate transportation chamber;
a first wheel (1) below the installation section and (2) having a first diameter, a distance from the installation surface to a lower end of the first wheel being a first length;
a second wheel (1) below the installation section, (2) farther away from the frame section than the first wheel and (3) having a second diameter smaller than the first diameter, a distance from the installation surface to a lower end of the second wheel being a second length smaller than the first length;
a supporter (1) below the installation section, (2) farther away from the frame section than the first wheel, (3) being adjustable such that a distance from the installation surface to a lower end of the supporter is in a range including the first length, and (4) being configured to selectively support the installation section; and
an adjustment plate on the wall (1) configured to receive and engage the lower wall fixation unit and (2) being vertically adjustable in height along the wall, wherein
the lower wall fixation unit includes a cylindrical bar part having a longitudinal axis parallel to a rotation axis of the first wheel, and
the installation section, the frame section, the first wheel, the adjustment plate and the supporter are configured such that (1) the cylindrical part is brought into engagement with and disengaged from the adjustment plate by rotation of the installation section and the frame section around the first wheel, (2) the first wheel supports the installation section and the frame section when the cylindrical bar part engages the adjustment plate and (3) the supporter can be positioned to support the installation section and the frame section when the cylindrical bar part engages the adjustment plate.

2. The load port apparatus according to claim 1, wherein the supporter is separate from the second wheel and closer to the second wheel than to the first wheel.

3. The load port apparatus according to claim 1, wherein the distance from the installation surface to the lower end of the first wheel and the distance from the installation surface to the lower end of the second wheel are unchangeable.

4. A load port apparatus comprising:
an installation section including an installation surface for installing a container containing a substrate;
a frame section (1) on one side of the installation section, (2) extending upward from the one side, and (3) including a lower wall fixation unit below the installation surface;
a first wheel (1) below the installation section and (2) having a first diameter, a distance from the installation surface to a lower end of the first wheel being a first length; and
a second wheel (1) below the installation section, (2) farther away from the frame section than the first wheel and (3) having a second diameter smaller than the first diameter,
wherein
the second wheel is configured such that:
a distance from the installation surface to a lower end of the second wheel is adjustable between a second length smaller than the first length and the first length; and
when the lower wall fixation unit is affixed to a wall, the second wheel can be adjusted such that the distance from the installation surface to the lower end of the second wheel is the first length, to support the installation section and the frame section.

5. The load port apparatus according to claim 4, further comprising an adjustment plate on a wall (1) configured to receive and engage the lower wall fixation unit and (2) being vertically adjustable in height along the wall.

6. An EFEM comprising:
the load port apparatus according to claim 1; and
the substrate transportation chamber including the wall with the plate.

7. A method of installing a load port apparatus including:
an installation section configured to install a container containing a substrate onto an installation surface;
a frame section (1) on one side of the installation section, (2) extending upward from the one side, and (3) including a lower wall fixation unit below the installation surface that is configured to be attached to and detachable from a wall of a substrate transportation chamber;
a first wheel (1) below the installation section and (2) having a first diameter, a distance from the installation surface to a lower end of the first wheel being a first length;
a second wheel (1) below the installation section, (2) farther away from the frame section than the first wheel and (3) having a second diameter smaller than the first diameter, a distance from the installation surface to a lower end of the second wheel being a second length smaller than the first length;
a supporter (1) below the installation section, (2) farther away from the frame section than the first wheel, (3) being adjustable such that a distance is from the installation surface to a lower end of the supporter is in a range including the first length, and (4) being configured to selectively support the installation section; and
an adjustment plate on the wall (1) configured to receive and engage the frame section and (2) being vertically adjustable in height along the wall, the method comprising the steps of:
contacting the first wheel and the second wheel with a floor and moving the installation section and the frame section along the floor to be adjacent the wall;
rotating the frame section and the installation section around the first wheel until the lower wall fixation unit engages the adjustment plate; and
contacting the supporter with the floor so that the distance from the installation surface to the lower end of the supporter is the first length.

8. An EEFM comprising:
the load port apparatus according to claim 4; and
the substrate transportation chamber including the wall with the adjustment plate.

* * * * *